(12) United States Patent
Van der Wagt

(10) Patent No.: US 6,859,075 B1
(45) Date of Patent: Feb. 22, 2005

(54) HIGH-SPEED OUTPUT BUFFER

(75) Inventor: Jan Paul Anthonie Van der Wagt, Newbury Park, CA (US)

(73) Assignee: Inphi Corporation, Westlake Village, CA (US)

( * ) Notice: Subject to any disclaimer, the term of this patent is extended or adjusted under 35 U.S.C. 154(b) by 0 days.

(21) Appl. No.: 10/612,371

(22) Filed: Jul. 2, 2003

(51) Int. Cl.[7] .............................................. H03B 1/00
(52) U.S. Cl. ...................................... 327/109; 327/487
(58) Field of Search .......................... 327/52, 108–110, 327/131, 170, 335, 427, 432–437, 478, 480–482, 485–489, 561–563, 491–492; 326/83, 89

(56) References Cited

U.S. PATENT DOCUMENTS

| | | | | |
|---|---|---|---|---|
| 5,430,337 | A | * 7/1995 | Castello et al. | 327/65 |
| 5,436,581 | A | * 7/1995 | Oberhauser | 327/50 |
| 5,977,818 | A | * 11/1999 | Czarnul et al. | 327/543 |
| 6,166,569 | A | * 12/2000 | McQuilkin | 327/105 |
| 6,246,269 | B1 | * 6/2001 | Schuler et al. | 327/110 |

OTHER PUBLICATIONS

E.M. Cherr, M. Sc. Ph.D., & D. E. Hooper, M.E. Graduates, Proceedings I.E.E. vol. 110, No. 2, Feb. 1963, "The design of wide–band transistor feedback amplifiers".

20–Gb/s Digital SSI's using AlGaAs/GaAs Heterojunction Bipolar Transistors for Future Optical Transmission Systems, Haruhiko Inchino, Member, IEEE, 1993.

* cited by examiner

*Primary Examiner*—My-Trang Nu Ton
(74) *Attorney, Agent, or Firm*—Koppel, Jacobs, Patrick & Heybl

(57) ABSTRACT

A robust output buffer component capable of providing high quality output signals comprising a cascode module for receiving a differential signal from a differential pair module and transmitting that differential signal as two output waveforms. Using a bipolar implementation example, the emitter end of a common base cascode pair is coupled to the collector end of a common emitter differential pair with an optional resistive module inserted between the cascode pair and the differential pair. Engineering the cascode bias, the resistance at the collector nodes of the differential pair and/or the resistance at the base nodes of the differential pair effects: the degree of non-linearity of the base-collector capacitance as a function of the base-collector voltage, the voltage swing of the collector nodes, and the degree of symmetry of the input voltages. These three parameters may be used to optimize the symmetry of the output waveforms.

37 Claims, 10 Drawing Sheets

A cascode transistor module is established (S1).

The resistive loads seen by the output nodes of the differential pair module are engineered to optimize the eye diagram shape or the $V_{cross,out}$ of the output signals of the cascode transistor module (S2).

Optionally, an optional cascode resistive module is used to alter the resistive loads seen by the output nodes of the differential pair module to further optimize the eye diagram shape or the $V_{cross,out}$ (S3).

Optionally, the resistance associated with the stage driving the differential pair is carefully selected (S4).

Optionally, the signal input to the differential pair module is pre-conditioned (S5).

Optionally, the output signals of the cascode transistor module are coupled to an inductive module (S6).

Figure 7

HIGH-SPEED OUTPUT BUFFER

BACKGROUND INFORMATION

1. Field of the Invention

The current invention relates to the field of electronic circuits and more particularly to the design and manufacture of high-speed output buffers.

2. Description of Related Art

As integrated circuits are designed to operate at increasingly higher frequencies, noisy, distorted, and/or inconsistent signals can cause devices such as output buffers to produce poor quality output. Preferably, an output buffer may provide a clean, symmetric, well-shaped output waveform even if the input signals are noisy or of poor quality. However, an output buffer may receive an asymmetric, low quality differential signal with a substantial and/or inconsistent amplitude variation and/or a common mode component. In many cases, the quality of the differential input signal may degrade with increased operating frequency. An eye diagram, constructed by overlaying the output votage waveforms for many clock cycles, may be used indicate the fidelity or quality of a signal put through an electronic buffer circuit. A high quality output waveform may have an eye diagram with a symmetric shape that approaches the shape of a square wave. Often, it is desirable to have a buffer output waveform with a centered or controllable crossing point (the point where the rising and falling signals intersect). The output crossing point may be characterized by the crossing point voltage ($V_{cross,out}$). For a differential output buffer, each of the output waveforms has an associated crossing point voltage.

One method for improving the quality of an output buffer signal and/or controlling $V_{cross,out}$ is to incorporate a feedback loop into the buffer's design. However, the incorporation of a feedback loop can be tricky and expensive to implement. This may be due, in part, to complexities related to designing a circuit that determines $V_{cross,out}$ from the actual output signal without highly restrictive assumptions about the data pattern. For instance, a static replica circuit cannot determine $V_{cross,out}$ because $V_{cross,out}$ depends on the shape of the rising and falling edges. Alternately, a correction signal may be generated and combined with the output buffer signal to yield the final output signal with a desirable $V_{cross,out}$. However, properly matching delays between the high-speed signal paths can be especially difficult.

Accordingly, it is desirable to have an inexpensive and robust output buffer designed for operation over a wide frequency range, capable of providing high quality output signals when provided with variable and/or poor quality differential input signals. Preferably, the output buffer may be manufactured using currently available semiconductor technologies and incorporated into small footprint integrated circuits.

SUMMARY OF THE INVENTION

It is an object of the current invention to provide a robust differential output buffer component designed to operate over a wide frequency range, capable of providing two high quality output signals even when provided with variable and/or poor quality differential input signals.

According to the current invention, the buffer component comprises a cascode module for receiving a differential current signal from a differential pair module and transmitting that differential signal as two output currents. Preferably, these two output currents are converted to two output voltages by two external load impedances. Often, in addition, "back termination" impedances may be present on-chip to minimize the impact of signal reflections in case of imperfect external termination. Typically, the differential pair module external to the current invention and the cascode module internal to the current invention may comprise sets of bipolar transistors and/or sets of field effect transistors (FETs). Using the example of a bipolar implementation, the emitter end of a common base cascode pair is coupled to the collector end of a common emitter differential pair. The resistance at the collector nodes of the differential pair is due in part to the characteristics of the cascode pair. Optionally, a resistive module, called a cascode resistive module, may be inserted between the cascode pair and the differential pair to further alter the resistance at the collector nodes of the differential pair. Additionally, the resistance due to the stage driving the differential pair may be engineered to alter the properties of the buffer output waveform. In some cases, optional resistive modules, called drive resistive modules, may be coupled to the inputs of the differential transistors (base nodes for bipolar implementations or gate nodes for FET implementations) to provide an additional small resistance for altering the properties of the buffer output waveform. According to the current invention, for each of the output signals of the high-speed buffer element, the symmetry of the rising waveform edge with respect to the falling waveform edge may be engineered. Continuing with the example of a bipolar implementation, the symmetry of the output signal waveforms may be manipulated by engineering three parameters:

1) the cascode bias
2) the resistance at the collector nodes of the differential pair
3) the resistance at the base nodes of the differential pair.

By engineering these three parameters, the average base-collector voltage, the voltage swing of the collector nodes of the transistor pair, and the symmetry of the input waveforms may be controlled, thereby providing substantial, self-controlled capacitance changes at the differential pair's collector nodes. This technique may be used to suppress effects due to the undesirable common mode signal component of the two output signals. For either of the buffer output voltages, this technique may be used to alter the symmetry of the rising and falling edges as represented by the $V_{cross,out}$ in an eye diagram. Whereas typical buffer component designs may minimize the resistances at the input and output nodes of the differential pair to minimize delays, according to the current invention, the shape of the output signal waveforms may be engineered and/or improved by altering these resistances.

According to an alternate embodiment of the current invention, a cascode resistive module may not always be required. For example, for buffer component implementations where the cascode pair is based on FETs, the resistance seen by the output nodes of the differential pair may be achieved by proper sizing of the cascode FETs.

Preferably, the current invention may be used to improve the quality of the two output signals of a high-speed differential buffer component by improving the symmetry of the output signals under expected operating conditions. However, according to an alternate embodiment of the current invention, the output signals may be engineered to alter the symmetry in other ways. For example, according to the current invention, the output signals may be purposely pre-distorted to compensate for opposite distortions expected from an electronic circuit driven by this buffer.

Optionally, coupling the current invention's output signals to an on-chip inductive module such as a pair of inductors or a transmission line pair coupled to a supply rail may help manage parasitic capacitance effects.

Optionally, preconditioning the input signals to the differential pair module with a Cherry-Hooper style amplifier (for example, see E. M. Cherry and D. E. Hooper, "The Design of Wide-band Transistor Feedback Amplifiers," Proc. I.E.E., vol. 110, No. 2, February 1963, pp. 375–389) may further improve the quality of the output signals provided by the current invention. This may be especially true for poor quality input signals with a substantial and/or inconsistent amplitude variation and/or a common mode component.

Advantageously, the current invention may be designed and built using currently available semiconductor technology and integrated into a variety of different devices such as, but not limited to, high-speed buffers, broad-band amplifiers, high-speed logic gates, narrow-band amplifiers, mixers, oscillators and/or systems such as, but not limited to, wireless local area networks, satellite communications devices, global positioning systems and high-speed communication systems.

BRIEF DESCRIPTION OF THE DRAWINGS

FIG. 7 illustrates a preferred process for improving high-speed buffer components according to the current invention.

DETAILED DESCRIPTION OF PREFERRED EMBODIMENTS

Figure 1A:
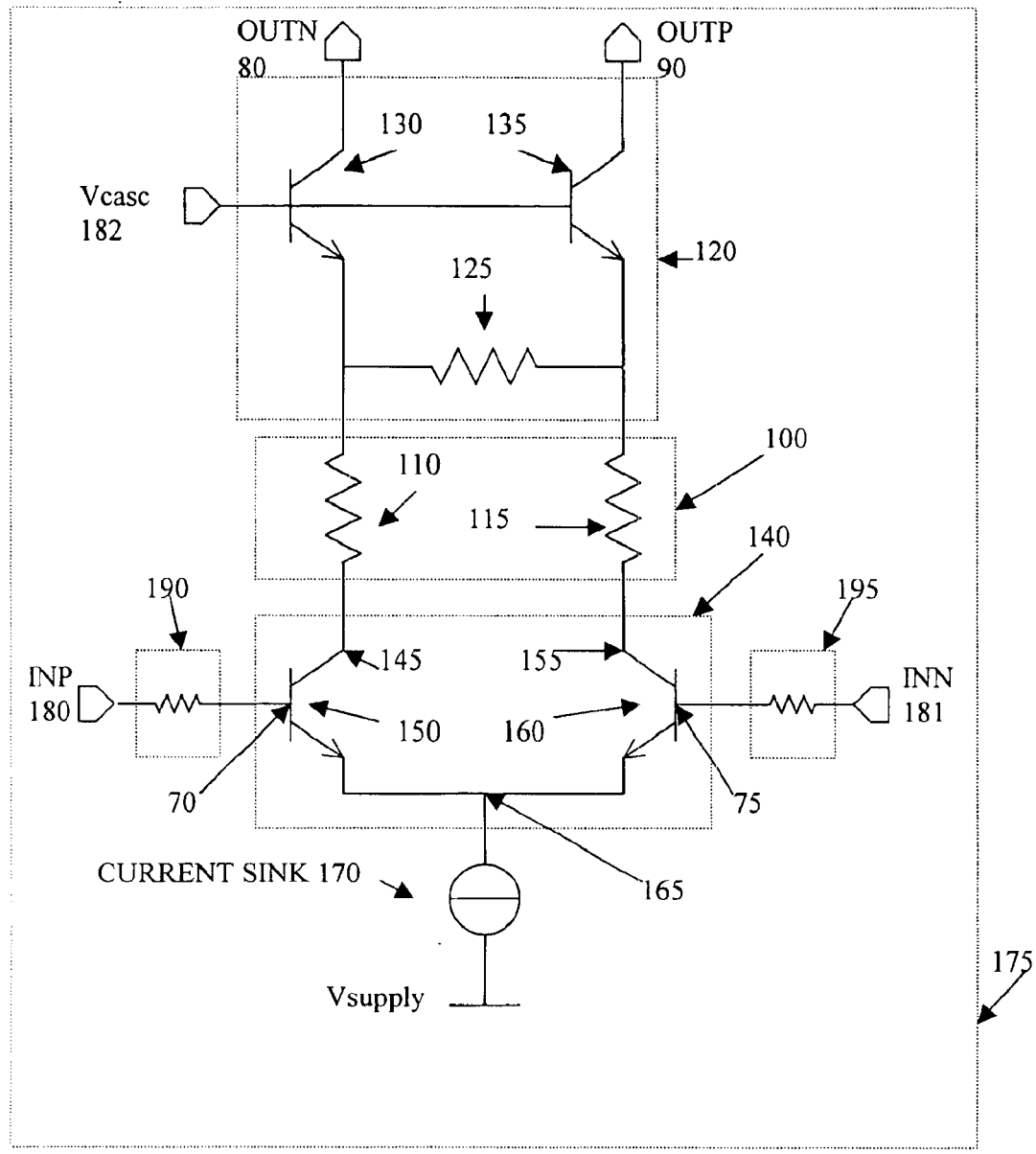
FIGS. 1A–D show schematic diagrams illustrating examples of high-speed buffer components according to the current invention.
Figure 1B:
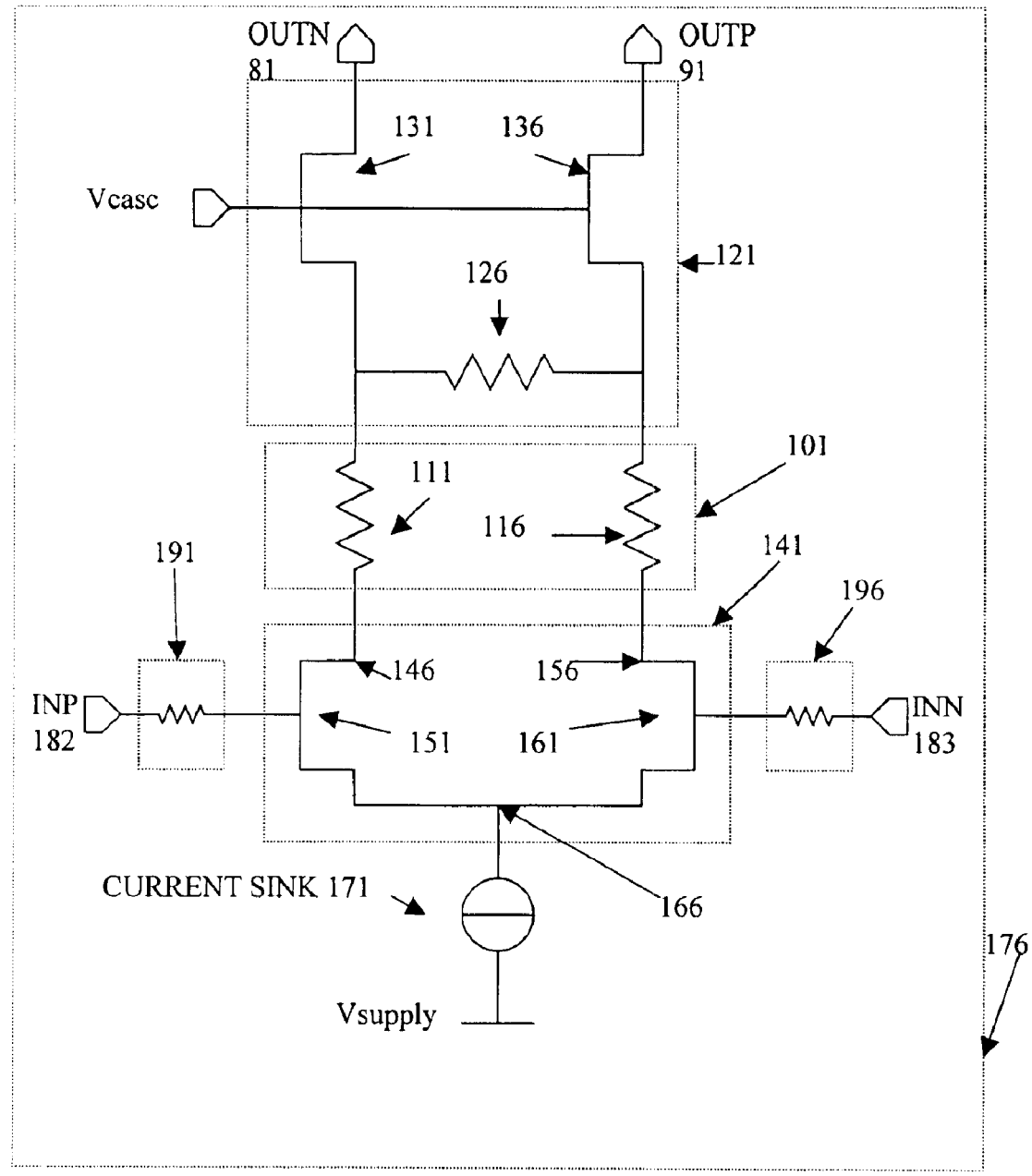
Figure 1C:
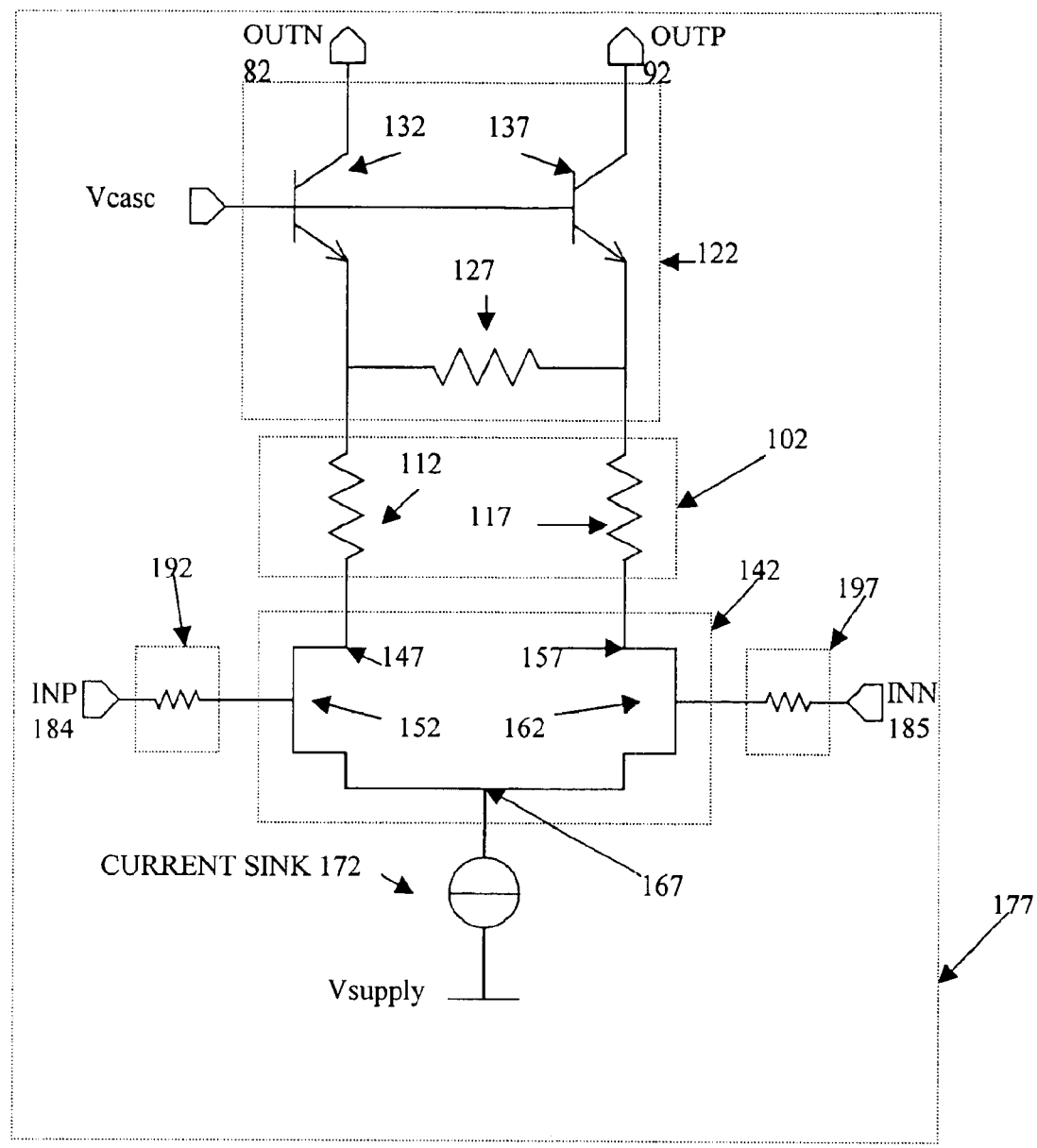
Figure 1D:
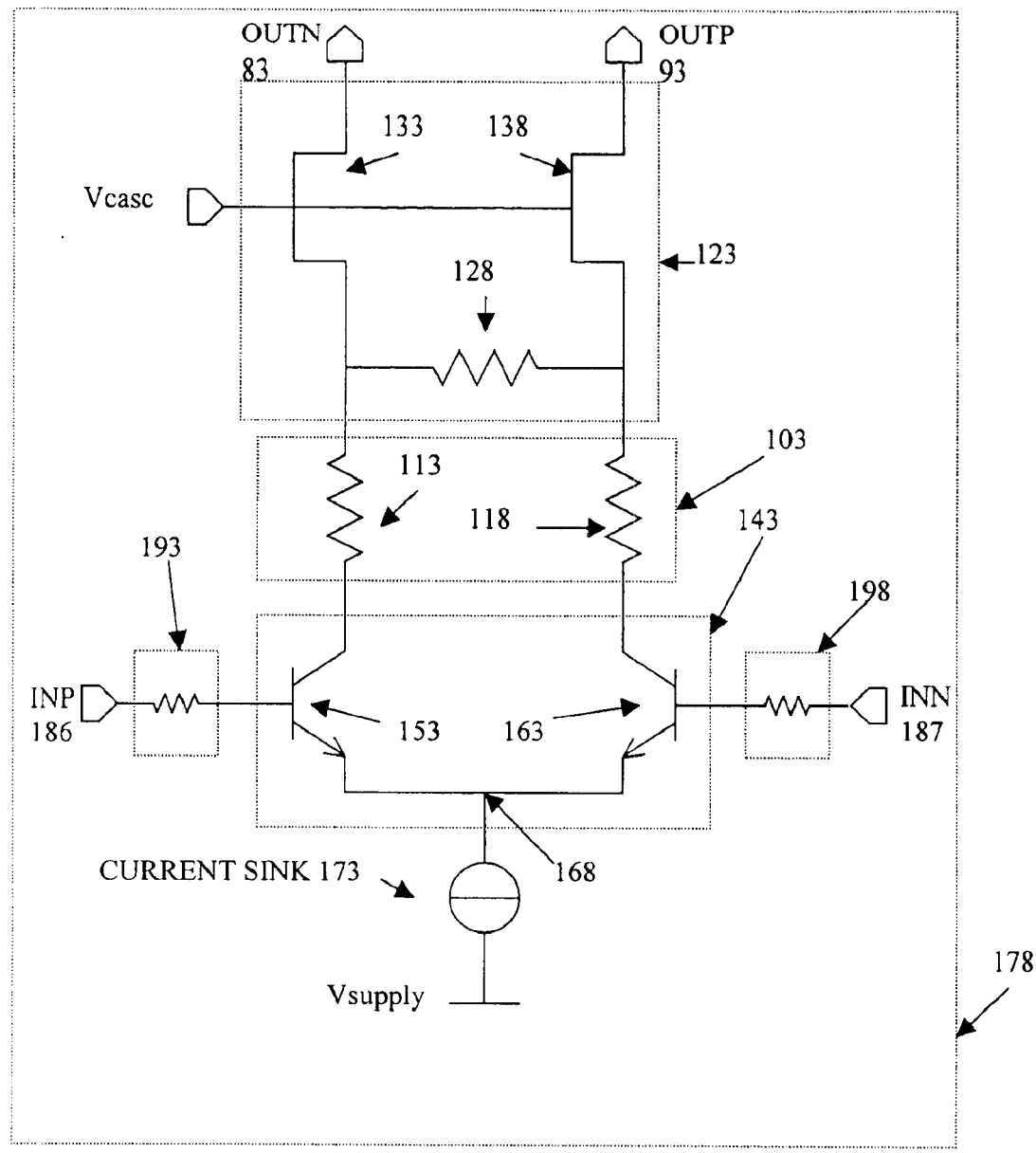

FIG. 1A shows a schematic diagram illustrating an example of a high-speed buffer component 120 according to the current invention. In this example, the high-speed buffer component 120 is used to create a high-speed buffer 175. In FIG. 1A, high-speed buffer component 120 and the differential pair module 140 of high-speed buffer 175 are implemented using bipolar transistors. Examples of bipolar transistors include, but are not limited to, bipolar junction transistors (BJTs) and hetero-junction bipolar transistors (HBTs). However, according to alternate embodiments of the current invention, devices such as, but not limited to, field effect transistors (FETs) or a combination of bipolar transistors and FETs may be used. These devices may be implemented using a variety of process technologies such as, but not limited to, CMOS (complementary metal oxide semiconductor), bi-CMOS and/or compound semiconductor processes. For example, FIG. 1B shows a schematic diagram illustrating an example of a FET implementation of a high-speed buffer component 121 according to the current invention. FIGS. 1C and 1D show schematic diagrams illustrating examples of mixed bipolar/FET implementations of high-speed buffers 177 and 178 according to the current invention.

According to a preferred embodiment of the current invention, the high-speed buffer component comprises a cascode module comprising a pair of cascode transistors. For bipolar implementations such as 120 and 122, the cascode module comprises cascode transistor pairs in a common base configuration. For FET implementations such as 121 and 123, the cascode transistor pairs are in a common gate configuration. Further, the high-speed buffer component may comprise one or more additional circuit elements, such as, but not limited to bleed resistors and/or other circuit elements, such as current sources, to provide keep-alive currents. For example, high-speed buffer component 120 includes a bleed resistor 125. Similarly, for FET implementations, the high-speed buffer component may comprise additional circuit elements.

According to the current invention, the buffer component comprises a cascode module for receiving a differential current signal from a differential pair module and transmitting that differential signal as two output currents. Preferably, the cascode module translates the differential pair collector currents with near unity gain to output currents. Preferably, these two output currents are converted to two output voltages by two external load impedances to a fixed supply. However, in some cases, one of the output current paths may be terminated to an on-chip supply. Often, in addition, "back termination" impedances may be present on-chip to minimize the impact of signal reflections in case of imperfect external termination. Typically, the differential pair module external to the current invention and the cascode module internal to the current invention may comprise sets of bipolar transistors and/or sets of field effect transistors (FETs). Using the example of a bipolar implementation, the emitter end of a common base cascode pair is coupled to the collector end of a common emitter differential pair.

Optional Cascode Resistive Module

According to the current invention, the optional cascode resistive module is coupled between the cascode module and the differential pair module. FIG. 1A illustrates an example of an optional cascode resistive module 100. According to a preferred embodiment, cascode resistive module 100 comprises two resistors in a parallel configuration. Preferably, the parallel resistors, such as resistor 110 and 115, have substantially identical properties. Preferably, resistors in the cascode resistive module are designed to have low resistance so that they will have a relatively small impact on the overall speed of the buffer device. Although the cascode resistive modules illustrated in FIGS. 1A–D each comprise two substantially identical resistors, it is envisioned that alternate embodiments of the current invention may comprise cascode resistive modules with asymmetric properties. Furthermore, in some cases, the cascode resistive module may comprise more than two resistors and/or other electronic elements.

Optional Drive Resistive Modules

According to the current invention, the optional drive resistive modules are coupled to the input nodes of the transistors in the differential pair module. Examples of optional drive resistive modules 190 and 195 are shown in FIG. 1A. According to a preferred embodiment, drive resistive module 190 comprises a single resistor. However, according to alternate embodiments of the current invention, a drive resistive module may comprise one or more resistors and/or other electronic elements such as electronic elements that may provide a resistive load. Preferably, each differential pair module transistor has an optional drive resistive module coupled to its input node. For example, in a bipolar implementation, the differential pair transistors may have drive resistive modules coupled to their base nodes; in a FET implementation, the differential pair transistors may have drive resistive modules coupled to their gates. Preferably, the optional drive resistive modules may be implemented in pairs with one optional drive resistive module per differential pair transistor. Preferably, the optional drive resistive modules, such as module 190 and 195, have substantially identical properties. However, according to alternate embodiments of the current invention, the optional drive resistive modules may have asymmetric properties. Preferably, resistors in the drive resistive module are designed to have low resistance so that they will have a relatively small impact on the overall speed of the buffer device.

According to the current invention, for each of the output signals of the high-speed buffer element, the symmetry of the rising waveform edge with respect to the falling waveform edge may be engineered. The symmetry of the output signal waveforms may be manipulated by engineering three parameters:

1) the cascode bias
2) the input resistances of the cascode module loading the collector nodes (for bipolar implementations) or the drain nodes (for FET implementations) of the differential pair.
3) the output resistances of the stage driving the base nodes (for bipolar implementations) or the gate nodes (for FET implementations) of the differential pair.

Considering the factors affecting the speed of bipolar transistor differential pair 140 may help illustrate techniques for engineering these parameters. An approximation of the dominant time constant ($\tau$) for the response from differential pair voltage inputs to differential pair current outputs may be represented by the following equation:

$$\tau = C_{be}R_{drive} + C_{bc}(R_{drive} + R_{casc} - g_m R_{drive} R_{casc}) \quad \text{(Equation 1)}$$

where:

$C_{be}$ is the transistor base-emitter capacitance $C_{bc}$ is the transistor base-collector capacitance $g_m$ is the transistor transconductance $R_{drive}$ is the resistance driving a differential pair transistor $R_{casc}$ is the resistance loading a differential pair transistor Equation (1) represents a first order analysis of the time constants associated with the response from the differential pair using a "half-circuit" analysis. In circuit design, the "half-circuit" analysis is sometimes used to analyze circuits intended for differential operation. In this case, Equation (1) tends to be most accurate in the region near the middle of the switching event, when the voltage inputs to the transistors in the differential pair are nearly equal. The "half-circuit" analysis assumes that the full circuit, including the circuit driving the buffer and any external loading of the buffer, is symmetric and we will assume this to be true for this illustration. In a half-circuit analysis of buffer 175, $R_{drive}$ is the sum of the resistance from the previous stage coupled at INP 180 and the resistance from optional drive resistive modules 190; $R_{casc}$ is the sum of the input resistance of one of the transistors 130 of the cascode module 120 and the resistance of a resistor 110 of the optional cascode resistive module 100. According to Equation (1), the time constant $\tau$ may be minimized by minimizing the values of $R_{drive}$, $R_{casc}$, and $C_{bc}$. For this reason, it is unusual to see a cascode resistive module such as 100 inserted in an ordinary high-speed buffer. The time constant $\tau$ may also be altered by altering $C_{be}$ and/or $g_m$. Typically, however, these variables are optimized to obtain a certain speed and power performance of the buffer. For large negative $V_{bc}$ values such as –1 V, $C_{bc}$ tends to be small. For example, for high-speed bipolar transistors with cut-off frequencies $f_T$ and maximum oscillation frequencies $f_{max}$ in excess of 10 GHz, a typical $C_{bc}$ value may be about 10 femto Farads (fF) when $V_{bc}$ is about –1 V. As $V_{bc}$ increases, the capacitance $C_{bc}$ increases and tends to rise rapidly in a non-linear fashion. In this example, for high-speed bipolar transistors with cut-off frequencies $f_T$ and maximum oscillation frequencies $f_{max}$ in excess of 10 GHz, a typical $C_{bc}$ value may be 100 fF or greater when $V_{bc}$ is about 0 V.

Operation of an Example of an Ordinary High-speed Buffer

Figure 2:
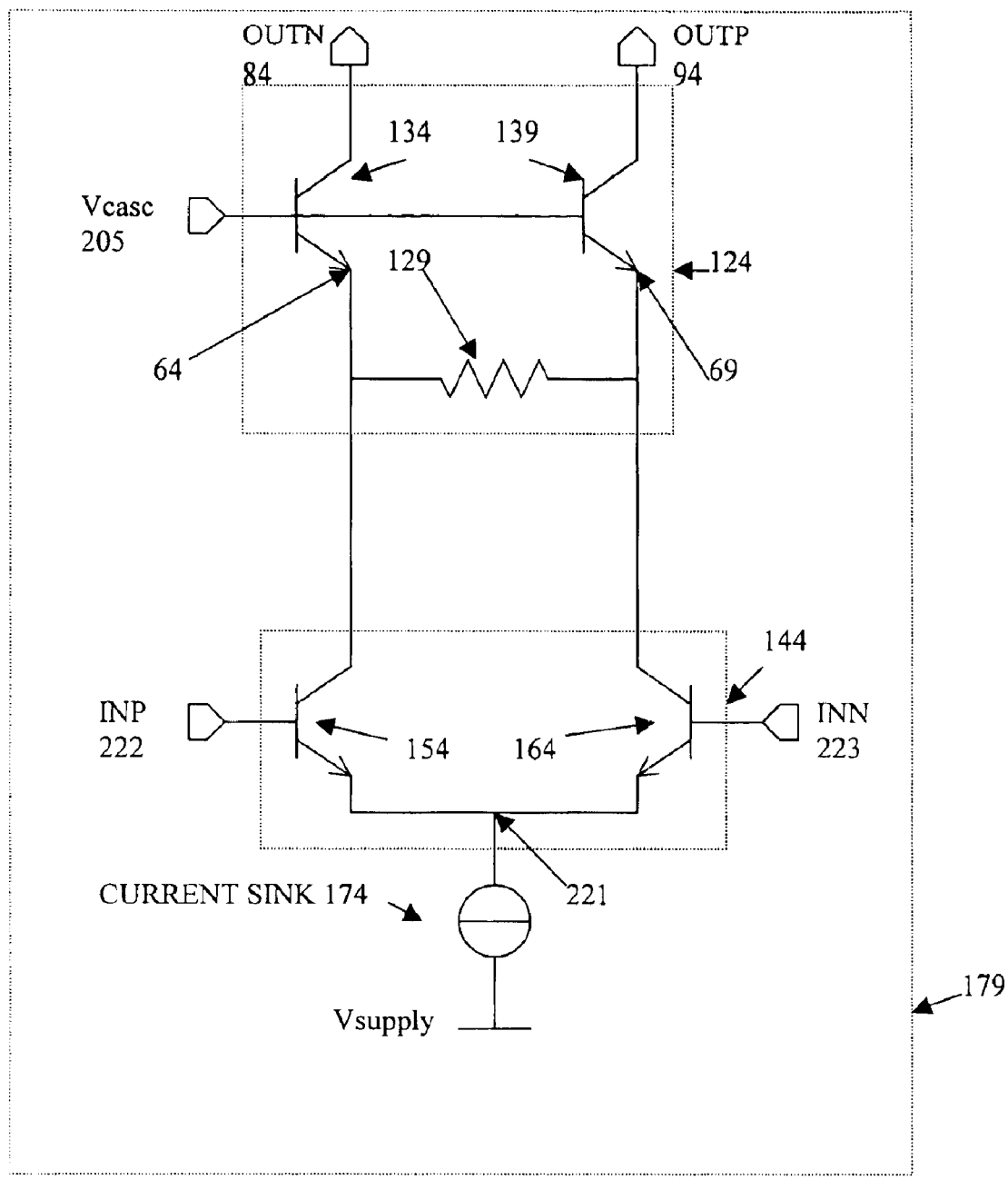
FIG. 2 illustrates an example of the output stage of an ordinary high-speed buffer.

To illustrate the value of the current invention, the operation of an example of an ordinary high-speed buffer will be compared to the operation of a buffer implementing the current invention. FIG. 2 illustrates an example of the output stage of an ordinary high-speed buffer. With the ordinary high-speed buffer 179, the $V_{casc}$ (common base voltage for cascode transistors 134 and 139) is maintained at a substantially constant potential. The low-impedance input nodes 64 and 69 of the cascode pair 124 (emitter nodes of transistors 134 and 139) provide light loading of the differential pair 144 output nodes leading to a fast response of the differential pair output currents to differential pair input voltages. These currents are input currents to cascode pair 124. Cascode pair 124 converts the input currents to output currents with a gain of close to unity. To support high-speed operation, the resistances driving the differential pair ($R_{drive}$) the resistances loading the differential pair ($R_{drive}$) and the differential pair transistor capacitances of typical high-speed buffers such as buffer 179 tend to be minimized.

Figure 3A:
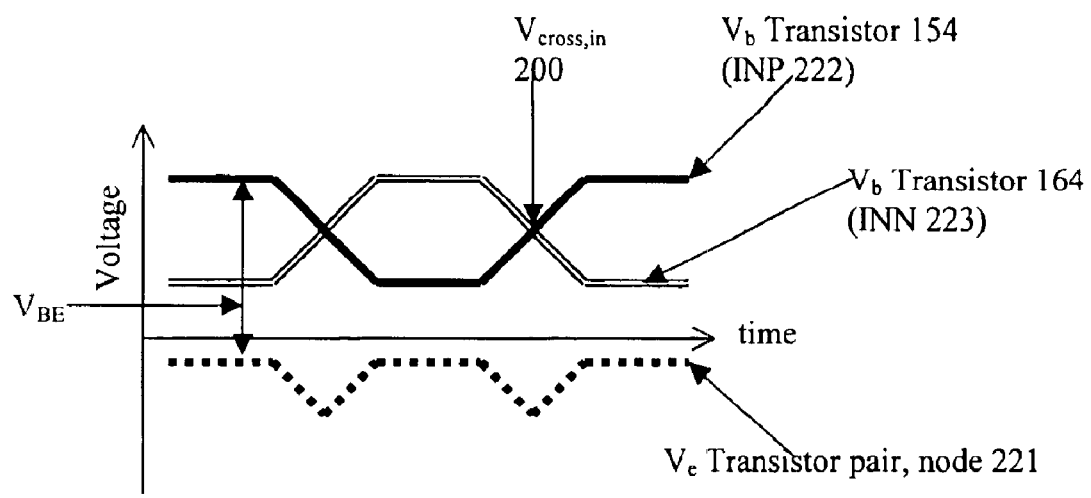
FIG. 3A illustrates an example of a typical input signal for an ordinary high-speed buffer with a high degree of symmetry between the rising edge and the falling edge, resulting in a centered $V_{cross,in}$.
Figure 4A:
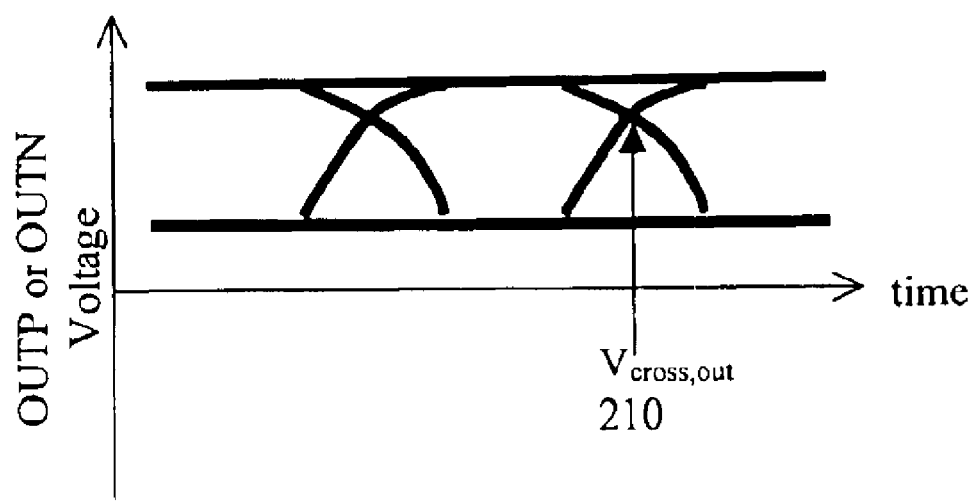
FIG. 4A illustrates an example of a resulting output eye diagram with a low degree of symmetry between the rising edge and the falling edge and a high value for $V_{cross,out}$.
Figure 4B:
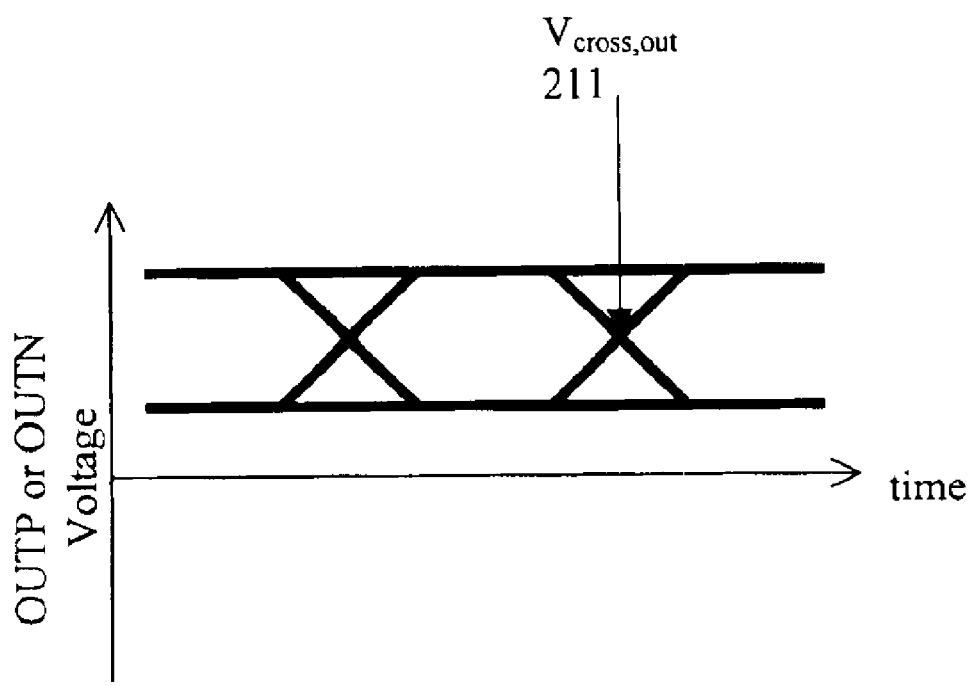
FIG. 4B illustrates an example of an output eye diagram with a high degree of symmetry between the rising edge and the falling edge and a centered $V_{cross,out}$.

For a finite, non-ideal current sink such as current sink 174, the current sink's output impedance affects the output waveforms of a current-mode output buffer, causing $V_{cross,out}$ for either of the outputs OUTP 94 or OUTN 84 to be higher than the average of the high and low output voltage levels of the buffer for an ordinary high-speed buffer such as buffer 179. FIG. 3A illustrates an example of a typical input signal for an ordinary high-speed buffer with a high degree of symmetry between the rising edge and the falling edge, resulting in a centered $V_{cross,in}$. In this example, considering the ordinary high-speed buffer 179, the approximate value of the common emitter node voltage ($V_e$) may be taken to be the maximum of the two input voltages (INP 222 and INN 223, in this case) minus the typical value for the base-emitter voltage ($V_{BE}$), when the transistor is on, as illustrated in FIG. 3A. $V_{BE}$ is technology dependent. For example, a common value for $V_{BE}$ in an Indium Phosphide (INP) based heterojunction bipolar transistor (HBT) is about 0.75 volts. When the input signals switch, the emitter node voltage assumes a minimum value. The finite output impedance of the current sink leads to a reduction of the current sink output current, resulting in a decrease in the total output current of the differential pair. This results in an increase in the common-mode output voltage of outputs OUTP 94 and OUTN 84 at the time of the switching event, causing $V_{cross,out}$ for either of the outputs OUTP 94 or OUTN 84 to rise above a centered value. FIG. 4A illustrates an example of a resulting output eye diagram with a low degree of symmetry between the rising edge and the falling edge and a high value for $V_{cross,out}$. FIG. 4B illustrates an example of an eye diagram with a high degree of symmetry between the rising edge and the falling edge and a centered $V_{cross,out}$. For each output voltage signal, the current invention provides a technique for obtaining a centered $V_{cross,out}$ by modifying a conventional output buffer such as buffer 179, which tends to exhibit a high $V_{cross,out}$.

Input-Output Capacitance

The current invention uses the fact that the input-output capacitance $C_{io}$ of the differential pair transistors (the capacitance between the voltage controlling input terminal of a transistor and the current mode output terminal of that same transistor) is a non-linear function of the voltage difference between these nodes, $V_{io}$. Preferably, an embodiment of the current invention may operate with a $V_{io}$ range such that $C_{io}$ shows a substantial, usable variation as a function of $V_{io}$ for $V_{io}$ values near the average $V_{io}$. For a bipolar differential pair implementation, $C_{io}$ would correspond to the capacitance between the base and the collector ($C_{bc}$); for a FET differential pair implementation, $C_{io}$ would correspond to the capacitance between the gate and the drain ($C_{gd}$).

Controlling $V_{cross,out}$ Using a Preferred Embodiment of the Current Invention For illustration, we will consider the operation of the bipolar high-speed buffer 175, however, it is understood that a similar analysis may be applied to the FET implementation. Initially, we consider high-speed buffer 175, as illustrated in FIG. 1A, with a low initial input voltage at INP 180 and a high initial input voltage at INN 181. This leads to a low base voltage at node 70 of transistor 150 ($V_{base,min}$) and a high base voltage at node 75 of transistor 160 ($V_{base,max}$). In this state, transistor 150 is "off" and transistor 160 is "on". The load impedance of transistors 150 is equal to the sum of the emitter input impedance of cascode transistor 150 of the cascode module 120 and the value of the resistor 110 of the optional cascode resistive module 100. Similarly, the load impedance of transistor 160 is equal to the sum of the emitter input impedance of cascode transistor 135 of the cascode module 120 and the value of the resistor 115 of the optional cascode resistive module 100. In a preferred embodiment of the invention, the load impedances are equal, and they will be referred to as $R_{casc}$ here. Initially, transistor 150 has a relatively low base-collector voltage ($V_{bc,min}=V_{base,min}-V_{collector,max}$) and a low base-collector capacitance $C_{bc,min}$ between its input and output nodes, while drawing a small output current from $R_{casc}$ and having a relatively high output voltage ($V_{collector,max}$) at node 145. Correspondingly, transistor 160 has a relatively high base-collector voltage ($V_{bc,max}=V_{base,max}-V_{collector,min}$) and a high base-collector capacitance $C_{bc,max}$, while drawing a large output current from $R_{casc}$ and having a relatively low output voltage ($V_{collector,min}$) at node 155. The cascode module translates the differential pair output currents to currents into load impedances to produce buffer output voltages, OUTP 90 and OUTN 80. Therefore, initially, OUTP 90 will be low and OUTN 80 will be high.

The following analysis assumes that the differential pair capacitances ($C_{bc}$) are in a region where their variation with $V_{bc}$ is significant. When the input to transistor 150 starts to switch to turn transistor 150 "on", initially, only a small amount of transistor output (collector) current is used to charge $C_{bc}$ of transistor 150 because this $C_{bc}$ is close to $C_{bc,min}$ which represents a large impedance relative to $R_{casc}$. The small loss of the transistor 150 output current translates into a small loss of the cascode transistor 130 output current. Therefore, the output voltage OUTN 80 falls only slightly slower than would be the case for an ideal differential pair transistor with a $C_{bc}$ of zero. When the input to transistor 160 starts to switch to turn transistor 160 "off", initially, a large amount of transistor output current is used to charge $C_{bc}$ of transistor 160 (relative to the current charging the $C_{bc}$ of transistor 150) because it is close to $C_{bc,max}$ which represents a smaller impedance than $C_{bc,min}$ relative to $R_{casc}$. The relatively large loss of transistor 160 output current translates into a relatively large loss of the cascode transistor 135 output current. Therefore, the output voltage OUTP 90 rises substantially slower than would be the case for an ideal differential pair transistor with a $C_{bc}$ of zero. During the second half of the switching event (after transistor 150 is mostly on and transistor 160 is mostly off), a relatively large fraction of the transistor 150 output current is charging transistor 150's $C_{bc}$ as it approaches $C_{bc,max}$ which represents a smaller impedance than $C_{bc,min}$ relative to that of $R_{casc}$. This sizable loss of transistor 150 output current, after "translation" through the cascode transistor 130, results in a slow final fall of the output voltage OUTN 80. Similarly, only a small portion of the transistor 160 output current is required to charge transistor 160's $C_{bc}$ as it approaches $C_{bc,min}$ which represents a larger impedance than $C_{bc,max}$ relative to $R_{casc}$. The small loss of transistor 160 output current, after "translation" through the cascode transistor 135, results in a relatively fast final rise of the output voltage OUTP 90. In this example, the falling output voltage OUTN 80 slows after it reaches mid-scale; the rising output voltage OUTP 90 slows before it reaches mid-scale. A similar analysis may be carried out with the initial state of INP 180 and INN 181 reversed and shows that the falling output voltage OUTP 90 slows after it reaches mid-scale, while the rising output voltage OUTN 80 slows before it reaches mid-scale. As a result, the $V_{cross,out}$ 211 of either of the differential pair output voltages (OUTP 90 or OUTN 80) moves down (compared to the ordinary high-speed buffer's $V_{cross,out}$ 210) and may achieve a more centered position as shown in FIG. 4B. The non-linear differential pair transistor capacitances $C_{bc}$ affect the output currents of the differential pair in such a manner that the $V_{cross,out}$ 211 of the buffer output voltages OUTP and OUTN tend to move down.

Figure 3B:
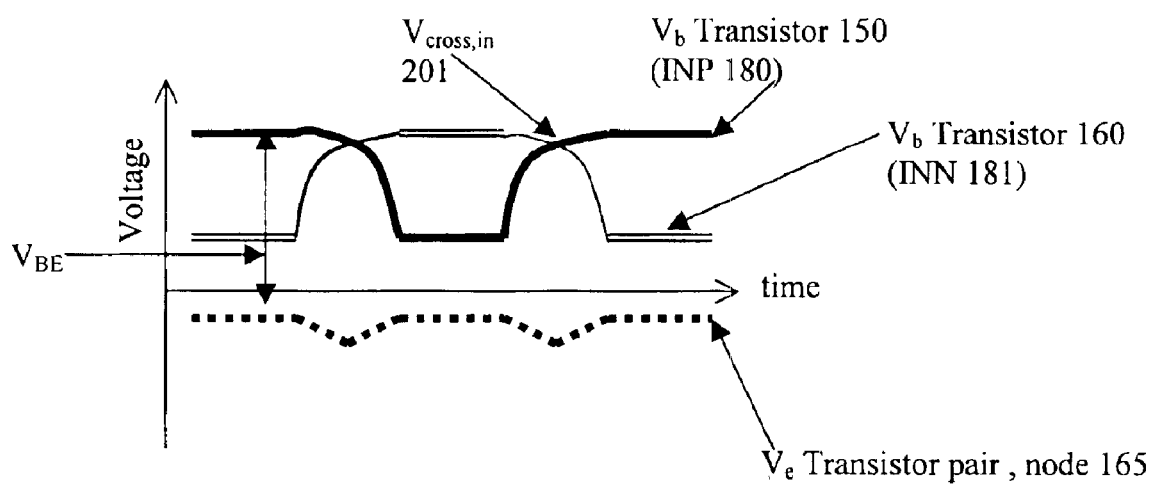
FIG. 3B illustrates an example of an input signal for a high-speed buffer implemented with buffer components according to a preferred embodiment of the current invention showing a low degree of symmetry between the rising edge and the falling is edge, exhibiting in a high value for $V_{cross,in}$.

Furthermore, the effect of the loss of input currents to the variable differential pair input-output capacitances (in this case with bipolar transistors, $C_{bc}$) may also lead to a lowering of $V_{cross,out}$ when the differential pair input impedances, $R_{drive}$, are taken into account. Starting from the same situation as described above, when the input INP 180 starts to switch to turn transistor 150 "on", initially, only a small amount of current from INP 180 is used to charge $C_{bc}$ of transistor 150 because $C_{bc}$ of transistor 150 is close to $C_{bc,min}$ which represents a large impedance relative to $R_{drive}$. The initial small loss of current to the $C_{bc}$ transistor 150 leads to a slightly slower rise of the input voltage to transistor 150 at node 70 relative to an ideal transistor with a $C_{bc}$ of zero. When the input INN 181 starts to switch to turn transistor 160 "off", initially, a relatively large amount of current from INN 181 is used to charge $C_{bc}$ of transistor 160 because it is close to $C_{bc,max}$ which represents a smaller impedance than $C_{bc,min}$ relative to $R_{drive}$. The initial large loss of current to the $C_{bc}$ of transistor 160 leads to a substantially slower fall of the input voltage to transistor 160 at node 75. During the second half of the switching event (after transistor 150 is mostly on and transistor 160 is mostly off), a relatively large fraction of current from INP 180 is charging transistor 150's $C_{bc}$ as it approaches $C_{bc,max}$, which represents a smaller impedance than $C_{bc,min}$ relative to $R_{drive}$. This sizable loss of current results in a slow final rise of the input voltage of transistor 150 at node 70. In contrast, only a small portion of current from IN 181 is required to charge transistor 160's $C_{bc}$ as it approaches $C_{bc,min}$ which represents a large impedance relative to $R_{drive}$. This small loss of current results in a relatively fast final fall of the input voltage of transistor 160 at node 75. FIG. 3B illustrates an example of an input signal for a high-speed buffer implemented with buffer components according to a preferred embodiment of the current invention showing a low degree of symmetry between the rising edge and the falling edge, exhibiting in a high value for $V_{cross,in}$. As illustrated in FIG. 3B, $V_{cross,in}$ 201 of the input voltages may be moved higher for output buffers such as output buffer 175 compared to the $V_{cross,in}$ 200 of the input voltages for ordinary high-speed output buffers such as 179. In contrast, ordinary high-speed output buffers may not shift the $V_{cross,in}$ of the input voltages. FIG. 3A illustrates a typical, centered $V_{cross,in}$ 200 of input voltages. A differential pair receiving a relatively high $V_{cross,in}$ of the input voltages, such as $V_{cross,in}$ 201 of the input voltages, may sustain less downward movement of the common emitter node 165 voltage ($V_e$) during switching. In FIG. 3B, the range of $V_e$ for output buffer 175 is reduced compared to the $V_e$ range for ordinary high-speed output buffer 179. Due to the limited range of $V_e$ at node 165, there is less modulation of the current from current sink 170. This limits the elevation of $V_{cross,out}$ typical of ordinary high-speed output buffers such as ordinary high-speed output buffer 179. As a result, the $V_{cross,out}$ of the output voltages may be lowered by the non-linear $C_{bc}$ effect on the input currents of the differential pair relative to the ordinary high-speed output buffer 179.

Accordingly, in the case of bipolar high-speed buffer 175, $V_{cross,out}$ of the output voltages may be engineered. In general, $V_{cross,out}$ of the output voltages may be decreased by:

1) increasing the rate of change of $C_{io}$ as a function of $V_{io}$
2) increasing the range $V_{io,max}-V_{io,min}$
3) increasing $V_{cross,in}$ of the input voltages.

For example, raising the average $V_{io}$ for each of the differential pair transistors (in the bipolar example of FIG. 1A, transistors 150 and 160) may increase the rate of change of $C_{io}$ as a function of $V_{io}$. This may be achieved by lowering the cascode module bias (for example, $V_{casc}$ at node 182) so that the average output voltages of the differential pair go down relative to the average input voltage level. This may cause a minor loss in output waveform speed. Furthermore, increasing the range $V_{io,max}-V_{io,min}$ may be achieved by increasing $R_{casc}$. For buffer 175, $R_{casc}$ is due to the input resistances of the cascode module 120 as well as the optional cascode resistive module 100. Again, a minor loss in output waveform speed may occur. Additionally, increasing $R_{drive}$ may increase $V_{cross,in}$ of the input voltages. For buffer 175, $R_{drive}$ is the resistance from the previous stage coupled at INP 180 and INN 181 as well as the resistance due to optional drive resistive modules 190 and 195. Again, this may introduce a loss in output waveform speed. However, in general, it is advisable not to rely solely on an increase in $R_{drive}$ to achieve an effective decrease in $V_{cross,out}$ of the output voltages as this may negatively impact the overall speed of the buffer. For example, as Equation (1) for the bipolar case shows, a substantial loss in output waveform speed may be incurred due to the first term ($C_{bc}R_{drive}$) which does not contribute to the nonlinear $C_{bc}$ effect.

For illustration, consider the case of buffer 175 where we may fix some of the variables in Equation (1). In this analysis, we depart from the "half-circuit" analysis where we assume that the time constants for the two transistors in the differential pair are equal and assess Equation (1) for each transistor. Equation (1) remains approximately valid for each transistor if the buffer circuit is not far from a balanced state. Even when the circuit is far from the balanced state, it gives a rough indication of the order of magnitude of the time constants involved for the two transistors. We begin by substituting some typical values for the variables in Equation (1):

$$R_{drive}=R_{casc}=10 \text{ ohm};$$

10 fF<$C_{bc}$<75 fF (the average $V_{bc}$ to the differential pair transistors is fixed such that $C_{bc}$ varies between 10 fF when $V_{bc}$ is near its minimum value and 75 fF when $V_{bc}$ is near its maximum value);

$$C_{be} \approx 75 \text{ fF};$$

$$g_m = 0.2 \text{ ohm}^{-1}.$$

Starting with a first transistor in the differential pair with a $V_{bc}$ is near its minimum value and the second transistor in the differential pair with a $V_{bc}$ is near its maximum value, we see that when $C_{bc}$ is less than $C_{be}$ (when $V_{bc}$ is near its minimum value), time constant τ may be about 1 picosecond (ps) for the first transistor. However, as the value of $C_{bc}$ approaches the value of $C_{be}$ (when $V_{bc}$ is near its maximum value), the second term of Equation (1) dominates and the time constant τ may increase to more than 4 ps for the second transistor. This analysis illustrates the effect that the response of one transistor is fast when the response of the other transistor is slow.

Pre-distorted Output

According to the current invention, the current invention may be used to pre-distort a signal. In some cases, it may be desirable to establish a $V_{cross,out}$ of the output voltages that is not centered. For example, a high or low $V_{cross,out}$ of the output voltages may be used to compensate for opposite distortions expected from a later circuit, cable, medium or device. In this case, altering the circuit parameters discussed above may be used to achieve this type of optimization of $V_{cross,out}$ of the output voltages.

Inductive Modules

Figure 5:
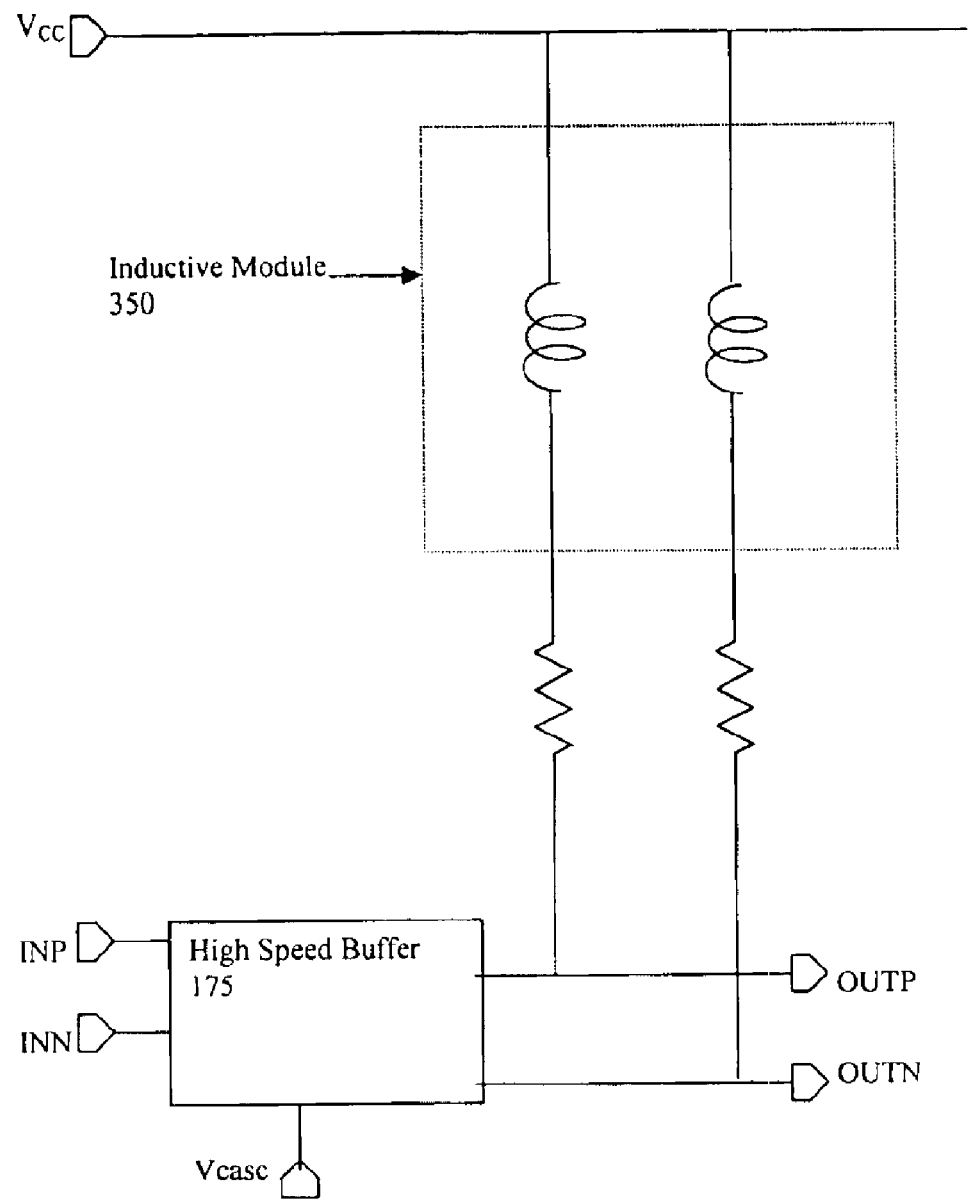
FIG. 5 illustrates an example of an optional inductive module coupled to a high-speed buffer implemented using a high-speed buffer element according to the current invention.

Optionally, coupling the current invention's output signals to an on-chip inductive module such as a pair of inductors or a transmission line pair coupled to a supply rail may help manage parasitic capacitance effects. FIG. 5 illustrates an example of an optional inductive module 350 coupled to a high-speed buffer 175 implemented using a high-speed buffer element according to the current invention.

Preconditioning the Input Signal

Figure 6:
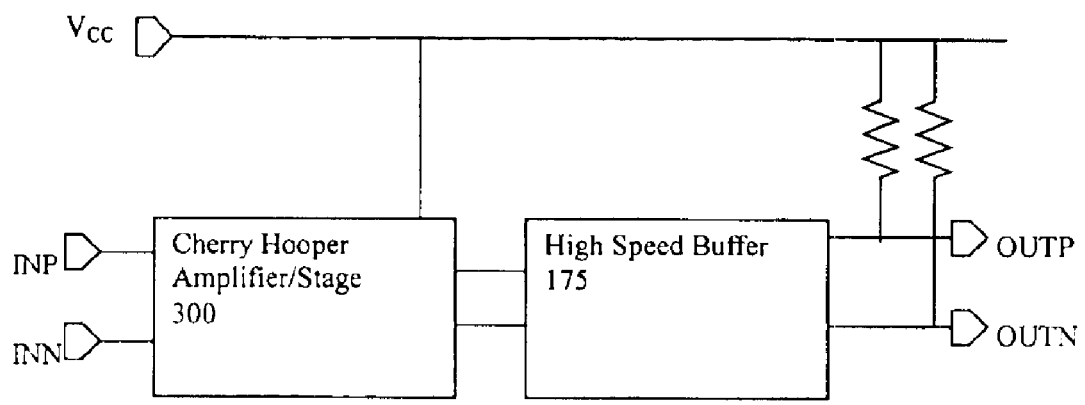
FIG. 6 illustrates an example of a two-stage buffer design incorporating a Cherry-Hooper style amplifier for preconditioning the input signal to a preferred embodiment of the current invention.

According to a preferred embodiment of the current invention, the high-speed buffer component may be used in a two stage buffer design. Two stage buffers may be used to pre-condition a signal before it is input to the current invention. For example, using this method, signal selectivity may be improved and/or the speed of a switching event may be increased or decreased to improve the waveform output by the current invention. According to a preferred embodiment of the current invention, the high-speed buffer component is coupled with a limiting amplifier such as a Cherry-Hooper style amplifier in order to obtain a very high-speed buffer. FIG. 6 illustrates an example of a two-stage buffer design incorporating a Cherry-Hooper style amplifier 300 for pre-conditioning the input signal to a preferred embodiment of the current invention. This type of configuration may be used to pre-condition poor quality input so that various embodiments of the current invention may still provide robust switching. Alternate embodiments of the current invention are envisioned using a variety of techniques for pre-conditioning the signal.

Although the preceding discussion, analysis and examples have focused on bipolar transistor implementations of high-speed buffer components according to the current invention, a variety of alternate embodiments exist. For example, a similar analysis may be done on FET and mixed bipolar/FET implementations. Similar techniques may be used to alter the symmetry of the cascode module's output waveforms for FET and mixed bipolar/FET implementations according to the current invention. Typically, in an implementation involving cascode FETs, the source impedance of a cascode FET tends to be higher than the emitter impedance of a bipolar transistor. In some cases, the optional cascode resistive module may not be used when careful sizing of the FETs to establish a high enough source impedance provides the desired effective resistance.

Advantageously, the current invention may be designed and built using currently available semiconductor technology and integrated into a variety of different devices such as, but not limited to, high-speed buffers, broad-band amplifiers, high-speed logic gates, narrow-band amplifiers, mixers, oscillators and/or systems such as, but not limited to, wireless local area networks, satellite communications devices, global positioning systems and high-speed communication systems.

Method

FIG. 7 illustrates a preferred process for improving high-speed buffer components according to the current invention. Preferably, according to the current invention, the method of improving high-speed output buffer components begins when a cascode transistor module is established (S1). According to the current invention, the cascode transistor module is configured to receive a differential current signal from a differential pair module and transmit that differential current signal into a pair of external load impedances. The process continues when the resistive loads seen by the output nodes of the differential pair module are engineered to optimize the eye diagram shape or the $V_{cross,out}$ of the output signals of the cascode transistor module (S2). For example, the cascode bias voltage may be selected according to one or more criteria. Altering the cascode bias voltage may shift the $V_{cross,out}$ up or down, so the optimal eye diagram shape or $V_{cross,out}$ may be considered when the cascode bias voltage is selected. In some cases, the characteristics of the transistors in the cascode transistor module may be carefully chosen to achieve the ideal resistive load. Optionally, the process continues when an optional cascode resistive module is used to alter the resistive loads seen by the output nodes of the differential pair module to further optimize the eye diagram shape or the $V_{cross,out}$ (S3). In some cases, the resistive loads may be altered by inserting an optional cascode resistive module between the cascode transistor module and the differential pair module. Optionally, the process continues when the resistance associated with the stage driving the differential pair is carefully selected (S4). The resistance associated with the driving stage may be carefully considered as this resistance, $R_{drive}$, may be used to shift the position of the $V_{cross,out}$. In some cases, an explicit optional drive resistive module may be coupled to the differential pair input. Alternately, careful sizing of the transistors driving the differential pair may be used to achieve an advantageous $R_{drive}$. Optionally, the process continues when the signal input to the differential pair module is pre-conditioned (S5). In some cases, an amplifier, buffer or stage such as a Cherry-Hooper style amplifier may be coupled to the input signals of the differential pair module in order to pre-condition the signal, and further improve the quality of the output of the buffer component, according to the current invention. Optionally, the process continues when the output signals of the cascode transistor module are coupled to an inductive module (S6). For example, an on-chip inductive module coupled to a supply rail may help manage parasitic capacitance effects.

The foregoing described embodiments of the invention are provided as illustrations and descriptions. They are not intended to limit the invention to precise form described. In particular, the Applicants contemplate that functional implementation of the invention described herein may be implemented equivalently using a variety of technologies and materials systems. Also, the process steps describing the methods may be re-arranged and/or re-ordered. Other variations and embodiments are possible in light of above teachings, and it is thus intended that the scope of invention not be limited by this Detailed Description, but rather by claims following.

What is claimed is:

1. A method for improving high-speed output buffer components comprising the steps of:

establishing a cascode transistor module comprising two transistors, each of which has a control input and first and second current terminals, establishing a differential pair module comprising two transistors, each of which has a control input and first and second current terminals, said cascode module connected to receive at its second current terminals a substantially differential current signal from the first terminals of said differential pair module and to transmit at its first current terminals said substantially differential current signal into a pair of external load impedances as a first output waveform and a second output waveform; and engineering the resistive loads seen by the first terminals of said differential pair module, based on one or more criteria thereby engineering the symmetry between the rising edge and the falling edge for each of said first output waveform and said second output waveform.

2. The method of claim 1 wherein said cascode transistor module's two transistors comprise first and second bipolar transistors, said cascode transistor module's first current terminals being the collectors of said first and second bipolar transistors and said cascode transistor module's second current terminals being the emitters of said first and second bipolar transistors.

3. The method of claim 1 wherein said cascode transistor module's two transistors comprise first and second field effect transistors (FETs), said cascode transistor module's first current terminals being the drains of said first and second FETs and said cascode transistor module's second current terminals being the sources of said first and second FETs.

4. The method of claim 1 wherein said differential pair module's two transistors comprise first and second bipolar transistors, said differential pair module's first current terminals being the collectors of said first and second bipolar transistors and said differential pair transistor module's second current terminals being the emitters of said first and second bipolar transistors.

5. The method of claim 1 wherein said differential pair module's two transistors comprise first and second field effect transistors (FETs), said differential pair module's first current terminals being the drains of said first and second FETs and said differential pair module's second current terminals being the sources of said first and second FETs.

6. The method of claim 1 wherein the step of engineering the resistive loads comprises the step of connecting a first resistive module between said cascode transistor module and said differential pair module such that said resistive module conducts said substantially differential current signal.

7. The method of claim 6 wherein said first resistive module comprises a first resistor connected between the first terminal of one of said differential pair module transistors and the second terminal of one of said cascode module transistors, and a second resistor connected between the first terminal of the other of said differential pair module transistors and the second terminal of the other of said cascode module transistors.

8. The method of claim 7 wherein said first resistor and said second resistor have substantially identical characteristics.

9. The method of claim 1 wherein the step of engineering the resistive loads comprises the step of selecting a cascode bias voltage for said cascode transistor module.

10. The method of claim 9 wherein the wherein the step of engineering the resistive loads comprises selecting resistance values for said loads to obtain a desired range $V_{io,max} - V_{io,min}$, where $V_{io}$ is the voltage between the control input and the first terminal of a differential pair module transistor.

11. The method of claim 9 wherein the step of engineering the resistive loads comprises selecting a cascode bias voltage to obtain a desired rate of change of $C_{io}$ as a function of $V_{io}$, where $C_{io}$ is the capacitance between the control input and the first terminal of a differential pair module transistor and $V_{io}$ is the voltage between the control input and the first terminal of a differential pair module transistor.

12. The method of claim 1 wherein the symmetry between the rising edge and the falling edge for each of said first output waveform and said second output waveform is optimized to achieve a symmetrical output waveform.

13. The method of claim 1 wherein the symmetry between the rising edge and the falling edge for each of said first output waveform and said second output waveform is optimized to achieve an asymmetrical output waveform.

14. A method for improving high-speed output buffer components comprising the steps of:
 establishing a cascode transistor module comprising two transistors, each of which has a control input and first and second current terminals;
 establishing a differential pair module comprising two transistors, each of which has a control input and first and second current terminals;
 said cascode module connected to receive at its second current terminals a substantially differential current signal from the first terminals of said differential pair module and to transmit at its first current terminals said substantially differential current signal into a pair of external load impedances as a first output waveform and a second output waveform;
 engineering the resistive loads seen by the first terminals of said differential pair module, based on one or more criteria thereby engineering the symmetry between the rising edge and the falling edge for each of said first output waveform and said second output waveform; and
 preconditioning the signal input applied to said differential pair module's control inputs.

15. The method of claim 14 wherein the step of preconditioning the signal input to said differential pair module comprises using one or more stages selected from the list of:
 an amplifier;
 a limiting amplifier;
 a buffer; and
 a Cherry-Hooper amplifier.

16. A method for improving high-speed output buffer components comprising the steps of:
 establishing a cascode transistor module comprising two transistors, each of which has a control input and first and second current terminals;
 establishing a differential pair module comprising two transistors, each of which has a control input and first and second current terminals;
 said cascode module connected to receive at its second current terminals a substantially differential current signal from the first terminals of said differential pair module and to transmit at its first current terminals said substantially differential current signal into a pair of external load impedances as a first output waveform and a second output waveform;
 engineering the resistive loads seen by the first terminals of said differential pair module, based on one or more criteria thereby engineering the symmetry between the rising edge and the falling edge for each of said first output waveform and said second output waveform; and
 establishing a driving stage which provides a signal input to the control inputs of the transistors of said differential pair module, and engineering the output resistance of said driving stage.

17. The method of claim 16 wherein the step of engineering the output resistance of said driving stage comprises engineering the symmetry between the rising edge and the falling edge for each of the signal input voltages supplied to the control inputs of the transistors of said differential pair module.

18. The method of claim 16 wherein the step of engineering the output resistance of said driving stage comprises one or more steps selected from the list of steps consisting of:
 connecting a second resistive module in series between said driving stage and the control input of one of the transistors of said differential pair; and,
 connecting a third resistive module in series between said driving stage and the control input of the other transistor of said differential pair.

19. The method of claim 18 wherein said second resistive module and said third resistive module are substantially identical.

20. The method of claim 18 wherein said second resistive module and said third resistive module comprise one or more resistors.

21. A method for improving high-speed output buffer components comprising the steps of:
 establishing a cascode transistor module comprising two transistors, each of which has a control input and first and second current terminals;
 establishing a differential pair module comprising two transistors, each of which has a control input and first and second current terminals;

said cascode module connected to receive at its second current terminals a substantially differential current, signal from the first terminals of said differential pair module and to transmit at its first current terminals said substantially differential current signal into a pair of external load impedances as a first output waveform and a second output waveform; and engineering the resistive loads seen by the first terminals of said differential pair module, based on one or more criteria thereby engineering the symmetry between the rising edge and the falling edge for each of said first output waveform and said second output waveform;

wherein said pair of external load impedances comprise one or more inductive modules.

22. An improved high-speed output buffer component comprising:

a cascode transistor module comprising two transistors, each of which has a control input and first and second current terminals;

a differential pair module comprising two transistors, each of which has a control input and first and second current terminals, said cascode transistor module arranged to receive at its second current terminals substantially differential current signal from the first terminals of said differential pair module and to transmit at its first current terminals said substantially differential current signal into a pair of external load impedances as a first output waveform and a second output waveform, wherein said cascode transistor module further comprises:

a resistive load comprising first and second resistances, said first resistance connected between the first terminal of one of said differential pair module transistors and the second terminal of one of said cascode module transistors, and said second resistance connected between the first terminal of the other of said differential pair module transistors and the second terminal of the other of said cascode module transistors; and a cascode bias voltage node for applying a cascode bias voltage to the control inputs of said cascode transistor module transistors, wherein the symmetry between the rising edge and the falling edge for each of said first output waveform and said second-output waveform may be altered by careful selection of one or more elements selected from the list of:

said resistive load, and said cascode bias voltage.

23. The improved high-speed output buffer component of claim 22 wherein said first and second resistance are due to the intrinsic properties of the differential pair module and the cascode transistor module transistors.

24. The improved high-speed output buffer component of claim 22 wherein said first and second resistances comprise first and second resistors, respectively.

25. The improved high-speed output buffer component of claim 24 wherein said first resistor and said second resistor have substantially identical characteristics.

26. The improved high-speed output buffer component of claim 22 wherein said cascode bias voltage is engineered to obtain a desired range $V_{io,max} - V_{io,min}$, where $V_{io}$ is the voltage between the control input and the first terminal of a differential pair module transistor.

27. The improved high-speed output buffer component of claim 22 wherein said cascode transistor module's two transistors comprise first and second bipolar transistors, said cascode transistor module's first current terminals being the collectors of said first and second bipolar transistors and said cascode transistor module's second current terminals being the emitters of said first and second bipolar transistors.

28. The improved high-speed output buffer component of claim 22 wherein said cascode transistor module's two transistors comprise first and second field effect transistors (FETs), said cascode transistor module's first current terminals being the drains of said first and second FETs and said cascode transistor module's second current terminals being the sources of said first and second FETs.

29. The improved high-speed output buffer component of claim 22 wherein said differential pair module's two transistors comprise first and second bipolar transistors, said differential pair module's first current terminals being the collectors of said first and second bipolar transistors and said differential pair transistor module's second current terminals being the emitters of said first and second bipolar transistors.

30. The improved high-speed output buffer component of claim 22 wherein said differential pair module's two transistors comprise first and second field effect transistors (FETs), said differential pair module's first current terminals being the drains of said first and second FETs and said differential pair module's second current terminals being the sources of said first and second FETs.

31. The improved high-speed output buffer component of claim 22 further comprising a bleed resistor connected between the second current terminals of said cascode transistor module's transistors.

32. The improved high-speed output buffer component of claim 22 further comprising one or more inductive modules coupled to the first terminals of said cascode transistor module.

33. The improved high-speed output buffer component of claim 22 further comprising:

a driving stage which provides a signal input to the control inputs of the transistors of said differential pair module;

a second resistive module connected in series between said driving stage and the control input of one of said differential pair module transistors; and a third resistive module connected in series between said driving stage and the control input of the other of said differential pair module transistors;

said second and third resistive modules engineered to obtain a desired symmetry between the rising edge and the falling edge for each of said first output waveform and said second output waveform.

34. The improved high-speed output buffer component of claim 33 wherein said second resistive module and said third resistive module are substantially identical.

35. The improved high-speed output buffer component of claim 33 wherein said second resistive module and said third resistive module comprise one or more resistors.

36. An improved high-speed output buffer component comprising:

a cascode transistor module comprising two transistors, each of which has a control input and first and second current terminals;

a differential pair module comprising two transistors, each of which has a control input and first and second current terminals, said cascode transistor module arranged to receive at its second current terminals a substantially differential current signal from the first terminals of said differential pair module and to transmit at its first current terminals said substantially differential current signal into a pair of external load impedances as a first output waveform and a second output waveform, wherein said cascode transistor module further comprises:

a resistive load comprising first and second resistances, said first resistance connected between the first terminal of one of said differential pair module transistors and the second terminal of one of said cascode module transistors, and said second resistance connected between the first terminal of the other of said differential pair module transistors and the second terminal of the other of said cascode module transistors; and a cascode bias voltage node for applying a cascode bias voltage to the control inputs of said cascode transistor module transistors, wherein the symmetry between the rising edge and the falling edge for each of said first output waveform and said second output waveform may be altered by careful selection of one or more elements selected from the list of:

said resistive load, and said cascode bias voltage; and one or more stages for preconditioning a differential input signal applied to said differential pair module's control inputs.

37. The improved high-speed output buffer component of claim 36 wherein said preconditioning stages comprise one or more stages selected from the list of:

an amplifier;

a limiting amplifier;

a buffer; and a Cherry-Hooper amplifier.

* * * * *